(12) United States Patent
Lee

(10) Patent No.: US 10,419,202 B2
(45) Date of Patent: Sep. 17, 2019

(54) SERIALIZER, DATA TRANSMITTING CIRCUIT, SEMICONDUCTOR APPARATUS AND SYSTEM INCLUDING THE SAME

(71) Applicant: SK hynix Inc., Icheon-si, Gyeonggi-do (KR)

(72) Inventor: Hyun Bae Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/895,837

(22) Filed: Feb. 13, 2018

(65) Prior Publication Data

US 2019/0013928 A1 Jan. 10, 2019

(30) Foreign Application Priority Data

Jul. 10, 2017 (KR) .................. 10-2017-0087241

(51) Int. Cl.
*H04L 7/027* (2006.01)
*H04L 7/00* (2006.01)
*H04L 7/033* (2006.01)
*H03K 5/135* (2006.01)
*H04J 3/06* (2006.01)

(52) U.S. Cl.
CPC ........... *H04L 7/0278* (2013.01); *H03K 5/135* (2013.01); *H04J 3/0685* (2013.01); *H04L 7/0008* (2013.01); *H04L 7/0041* (2013.01); *H04L 7/033* (2013.01)

(58) Field of Classification Search
USPC .................. 375/362, 295; 341/100, 204
See application file for complete search history.

(56) References Cited

U.S. PATENT DOCUMENTS

| | | | |
|---|---|---|---|
| 6,107,946 A * | 8/2000 | Jeong | H03K 19/01859 341/101 |
| 6,417,790 B1 | 7/2002 | Fiedler et al. | |
| 8,327,204 B2 * | 12/2012 | Hafed | G01R 31/31709 714/700 |
| 8,743,642 B2 | 6/2014 | Lee | |
| 9,979,535 B2 * | 5/2018 | Jung | G11C 7/106 |
| 2003/0210603 A1 * | 11/2003 | Ong | G11C 7/1051 365/233.1 |
| 2011/0157104 A1 * | 6/2011 | Kang | G09G 3/2096 345/204 |
| 2011/0205824 A1 * | 8/2011 | Kajigaya | G11C 7/1006 365/219 |
| 2016/0043755 A1 * | 2/2016 | Kim | H04B 1/0483 375/295 |
| 2016/0359611 A1 * | 12/2016 | Nallani | H03L 7/0802 |
| 2017/0063353 A1 * | 3/2017 | Coteus | H03K 5/01 |
| 2017/0310412 A1 * | 10/2017 | Gupta | H04J 3/0682 |
| 2019/0052253 A1 * | 2/2019 | Quek | H03K 5/135 |

* cited by examiner

*Primary Examiner* — Eva Y Puente
(74) *Attorney, Agent, or Firm* — William Park & Associates Ltd.

(57) ABSTRACT

A serializer may include a pre-buffer stage and a main buffer stage. The pre-buffer stage may be configured to generate a plurality of delayed signals by buffering a plurality of signals in synchronization with a plurality of pre-clock signals, respectively. The main buffer stage may be configured to generate an output signal by buffering the plurality of delayed signals in synchronization with a plurality of main clock signals, respectively. The plurality of pre-clock signals may have phase differences from the plurality of main clock signals, respectively.

17 Claims, 6 Drawing Sheets

SERIALIZER, DATA TRANSMITTING CIRCUIT, SEMICONDUCTOR APPARATUS AND SYSTEM INCLUDING THE SAME

CROSS-REFERENCES TO RELATED APPLICATION

The present application claims priority under 35 U.S.C. § 119(a) to Korean application number 10-2017-0087241, filed on Jul. 10, 2017 in the Korean Intellectual Property Office, which is incorporated herein by reference in its entirety.

BACKGROUND

1. Technical Field

Various embodiments may generally relate to a semiconductor technology and, more particularly, to a serializer and a data transmitting circuit, a semiconductor apparatus, and a system including the same.

2. Related Art

An electronic device includes a lot of electronic elements, and a computer system includes lots of electronic elements comprising semiconductor apparatuses. The semiconductor apparatuses of the computer system may transmit data in synchronization with a clock, and may perform serial communication. The semiconductor apparatuses may parallelize serialized data provided from another semiconductor apparatus in order to promptly process a great amount of data. Also, the semiconductor apparatuses may serialize internal data, which is parallelized, and provide the serialized data to another semiconductor apparatus. That is, the semiconductor apparatuses may include a serializer configured to serialize parallelized data for serial communication over a data bus.

In general, a serializer may sequentially output a plurality of data by synchronizing itself to an edge of a clock. The current trend for research and development (R&D) with regards to a computer system and a semiconductor apparatus is towards high operation speeds and lower power consumption. A clock speed becomes higher as an operation speed of a system increases, and durations of a clock and data shortens or becomes narrower as power consumption of a system lessens. Therefore, a serializer capable of correctly serializing data, according to the current trend of research and development, is required.

SUMMARY

In an embodiment, a serializer may be provided. The serializer may include a pre-buffer stage configured to generate a plurality of delayed signals by buffering a plurality of signals in synchronization with a plurality of pre-clock signals, respectively. The serializer may include a main buffer stage configured to generate an output signal by buffering the plurality of delayed signals in synchronization with a plurality of main clock signals, respectively. The plurality of pre-clock signals may have phase differences from the plurality of main clock signals, respectively.

In an embodiment a serializer may be provided. The serializer may include a pre-buffer stage configured to generate a first delayed signal by buffering a first signal in synchronization with a first clock signal, and generate a second delayed signal by buffering a second signal in synchronization with a second clock signal. The serializer may include a main buffer stage configured to generate an output signal by buffering the first delayed signal in synchronization with the second clock signal.

In an embodiment, a serializer may be provided. The serializer may include a pre-buffer stage configured to generate first to fourth delayed signals by buffering first to fourth signals in synchronization with first to fourth clock signals, respectively. The serializer may include a main buffer stage configured to generate an output signal by buffering the first to fourth delayed signals in synchronization with the first to fourth clock signals, respectively.

In an embodiment, a data transmission circuit may be provided. The data transmission circuit may include a pipe latch circuit configured to output first to fourth data by arranging a plurality of internal data groups. The data transmission circuit may include a pre-buffer stage configured to generate first to fourth delayed data by buffering the first to fourth data in synchronization with first to fourth clock signals, respectively. The data transmission circuit may include a main buffer stage configured to generate an output data by buffering the first to fourth delayed data in synchronization with the first to fourth clock signals, respectively.

DETAILED DESCRIPTION

Hereinafter, a semiconductor apparatus according to various embodiments will be described below with reference to the accompanying drawings through examples of embodiments.

Figure 1:
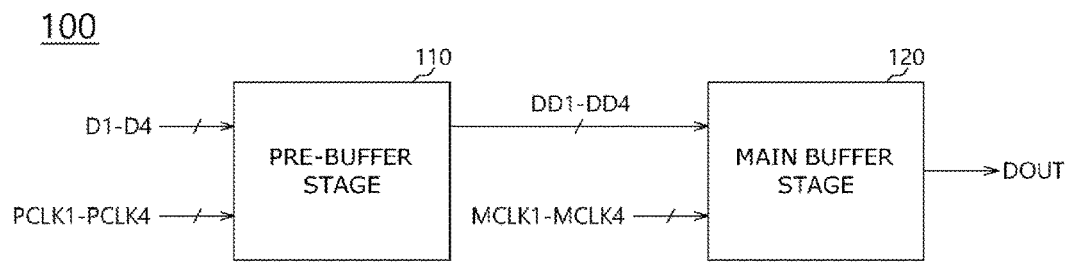
FIG. 1 is a schematic diagram illustrating a representation of an example of a configuration of a serializer in accordance with an embodiment.

FIG. 1 is a schematic diagram illustrating a representation of an example of a configuration of a serializer 100 in accordance with an embodiment. Referring to FIG. 1, the serializer 100 may include a pre-buffer stage 110 and a main buffer stage 120. The pre-buffer stage 110 may generate a plurality of delayed signals by buffering a plurality of signals based on a plurality of clock signals, respectively. The plurality of clock signals may be a plurality of pre-clock signals PCLKs. The plurality of signals Ds may be data. The pre-buffer stage 110 may generate a plurality of delayed signals DDs by buffering the plurality of signals Ds based on the plurality of pre-clock signals PCLKs, respectively. The pre-buffer stage 110 may receive first to fourth pre-clock signals PCLK1 to PCLK4 and first to signals D1 to D4. Even though FIG. 1 exemplifies the serializer 100 receiving four clock signals and four signals, the particular number does not have intention to limit the present disclosure. For example, numbers of the clock signals and the signals may be eight or sixteen, respectively. For example, numbers of the clock signals and the signals may be greater or less than four depending on a desired configuration.

The pre-buffer stage 110 may generate a first delayed signal DD1 by buffering the first signal D1 in synchronization with the first pre-clock signal PLCK1. The pre-buffer stage 110 may generate a second delayed signal DD2 by buffering the second signal D2 in synchronization with the second pre-clock signal PLCK2. The pre-buffer stage 110 may generate a third delayed signal DD3 by buffering the third signal D3 in synchronization with the third pre-clock signal PLCK3. The pre-buffer stage 110 may generate a fourth delayed signal DD4 by buffering the fourth signal D4 in synchronization with the fourth pre-clock signal PLCK4. In an embodiment, the pre-buffer stage 110 may receive complementary signals of the first to fourth signals D1 to D4 together with the first to fourth signals D1 to D4, and may generate complementary signals of the first to fourth delayed signals DD1 to DD4 together with the first to fourth delayed signals DD1 to DD4.

The first to fourth pre-clock signals PCLK1 to PCLK4 may have different phases from one another. For example, the first pre-clock signal PCLK1 may have a leading phase to the second pre-clock signal PCLK2, the second pre-clock signal PCLK2 may have a leading phase to the third pre-clock signal PCLK3, and the third pre-clock signal PCLK3 may have a leading phase to the fourth pre-clock signal PCLK4. Each phase difference between the first to fourth pre-clock signals PCLK1 to PCLK4 may be 90 degrees. The first pre-clock signal PCLK1 may have a phase difference of 90 degrees from the second pre-clock signal PCLK2, the second pre-clock signal PCLK2 may have a phase difference of 90 degrees from the third pre-clock signal PCLK3, the third pre-clock signal PCLK3 may have a phase difference of 90 degrees from the fourth pre-clock signal PCLK4, and the fourth pre-clock signal PCLK4 may have a phase difference of 90 degrees from the first pre-clock signal PCLK1. When a number of the pre-clock signals is eight, the eight pre-clock signals may have a phase difference of 45 degrees from each other. The phase differences of the pre-clock signals may be different from those described.

The main buffer stage 120 may generate an output signal DOUT by buffering the plurality of delayed signals DDs, which are output from the pre-buffer stage 110, based on a plurality of clock signals, respectively. The plurality of clock signals may be a plurality of main clock signals MCLKs. The main buffer stage 120 generate the output signal DOUT by buffering the plurality of delayed signals DDs, which are output from the pre-buffer stage 110, based on the plurality of main clock signals MCLKs, respectively. The main buffer stage 120 may receive first to fourth main clock signals MCLK1 to MCLK4 and the first to fourth delayed signals DD1 to DD4. The main buffer stage 120 may generate the output signal DOUT by buffering the first to fourth delayed signals DD1 to DD4 in synchronization with the first to fourth main clock signals MCLK1 to MCLK4, respectively. The output signal DOUT may be a signal stream including information corresponding to the first to fourth signals D1 to D4 or the first to fourth delayed signals DD1 to DD4.

The main buffer stage 120 may generate the output signal DOUT by buffering the first delayed signal DD1 in synchronization with the first main clock signal MCLK1. The main buffer stage 120 may generate the output signal DOUT by buffering the second delayed signal DD2 in synchronization with the second main clock signal MCLK2. The main buffer stage 120 may generate the output signal DOUT by buffering the third delayed signal DD3 in synchronization with the third main clock signal MCLK3. The main buffer stage 120 may generate the output signal DOUT by buffering the fourth delayed signal DD4 in synchronization with the fourth main clock signal MCLK4. In an embodiment, the main buffer stage 120 may receive complementary signals of the first to fourth delayed signals DD1 to DD4 together with the first to fourth delayed signals DD1 to DD4, and may generate a complementary signal of the output signal DOUT together with the output signal DOUT.

The first to fourth main clock signals MCLK1 to MCLK4 may have sequentially different phases from one another. For example, the first main clock signal MCLK1 may have a leading phase of 90 degrees to the second main clock signal MCLK2, the second main clock signal MCLK2 may have a leading phase of 90 degrees to the third main clock signal MCLK3, and the third main clock signal MCLK3 may have a leading phase of 90 degrees to the fourth main clock signal MCLK4. The main clock signal MCLK may have a lagging phase to the pre-clock signal PCLK. For example, the first main clock signal MCLK1 may have a lagging phase of 90 degrees to the first pre-clock signal PCLK1, the second main clock signal MCLK2 may have a lagging phase of 90 degrees to the second pre-clock signal PCLK2, the third main clock signal MCLK3 may have a lagging phase of 90 degrees to the third pre-clock signal PCLK3, and the fourth main clock signal MCLK4 may have a lagging phase of 90 degrees to the fourth pre-clock signal PCLK4. That is, the first main clock signal MCLK1 may have the corresponding phase to the fourth pre-clock signal PCLK4, the second main clock signal MCLK2 may have the corresponding phase to the first pre-clock signal PCLK1, the third main clock signal MCLK3 may have the corresponding phase to the second pre-clock signal PCLK2, and the fourth main clock signal MCLK4 may have the corresponding phase to the third pre-clock signal PCLK3.

In an embodiment of the present disclosure, a single clock signal may be used as the pre-clock signal PCLK and the main clock signal MCLK. For example, when the serializer 100 receives first to fourth clock signals having phase difference of 90 degrees between each other, the first clock signal may be used as the first pre-clock signal PCLK1 and the second main clock signal MCLK2. The second clock signal may be used as the second pre-clock signal PCLK2 and the third main clock signal MCLK3. The third clock signal may be used as the third pre-clock signal PCLK3 and the fourth main clock signal MCLK4. The fourth clock signal may be used as the fourth pre-clock signal PCLK4 and the first main clock signal MCLK1.

Figure 2:
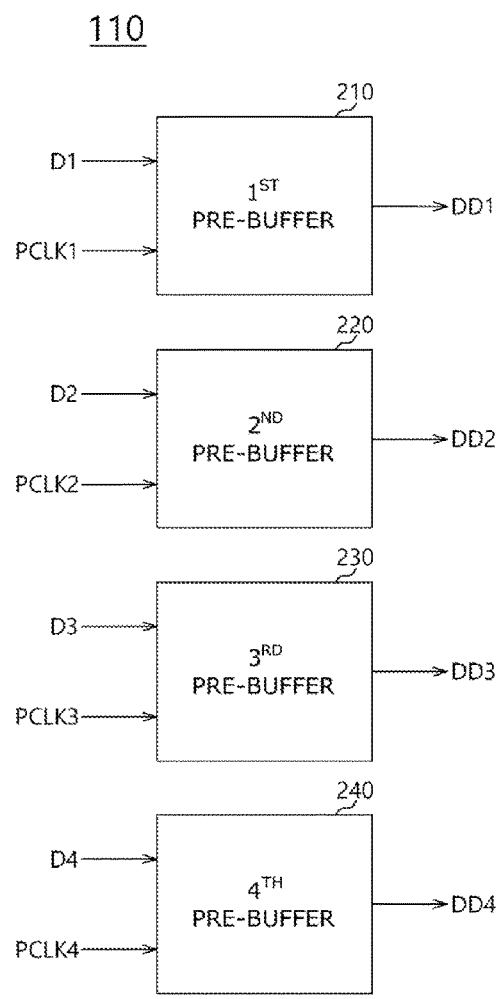
FIG. 2 is a schematic diagram illustrating a representation of an example of a configuration of a pre-buffer stage illustrated in FIG. 1.

FIG. 2 is a schematic diagram illustrating a representation of an example of a configuration of the pre-buffer stage 110 illustrated in FIG. 1. Referring to FIG. 2, the pre-buffer stage 110 may include first to fourth pre-buffers 210 to 240. The first pre-buffer 210 may receive the first signal D1 and the first pre-clock signal PCLK1, and may generate the first delayed signal DD1. The first pre-buffer 210 may generate the first delayed signal DD1 by buffering the first signal D1 during a high-level section of the first pre-clock signal PCLK1. The second pre-buffer 220 may receive the second signal D2 and the second pre-clock signal PCLK2, and may generate the second delayed signal DD2. The second pre-buffer 220 may generate the second delayed signal DD2 by buffering the second signal D2 during a high-level section of the second pre-clock signal PCLK2. The third pre-buffer 230 may receive the third signal D3 and the third pre-clock signal PCLK3, and may generate the third delayed signal DD3. The third pre-buffer 230 may generate the third delayed signal DD3 by buffering the third signal D3 during a high-level section of the third pre-clock signal PCLK3. The fourth pre-buffer 240 may receive the fourth signal D4 and the fourth pre-clock signal PCLK4, and may generate the fourth delayed signal DD4. The fourth pre-buffer 240 may generate the fourth delayed signal DD4 by buffering the fourth signal D4 during a high-level section of the fourth pre-clock signal PCLK4. In an embodiment, the first to fourth pre-buffers 210 to 240 may receive complementary signals of the first to fourth signals D1 to D4 together with the first to fourth signals D1 to D4, respectively, and may generate complementary signals of the first to fourth delayed signals DD1 to DD4 together with the first to fourth delayed signals DD1 to DD4, respectively.

Figure 3:
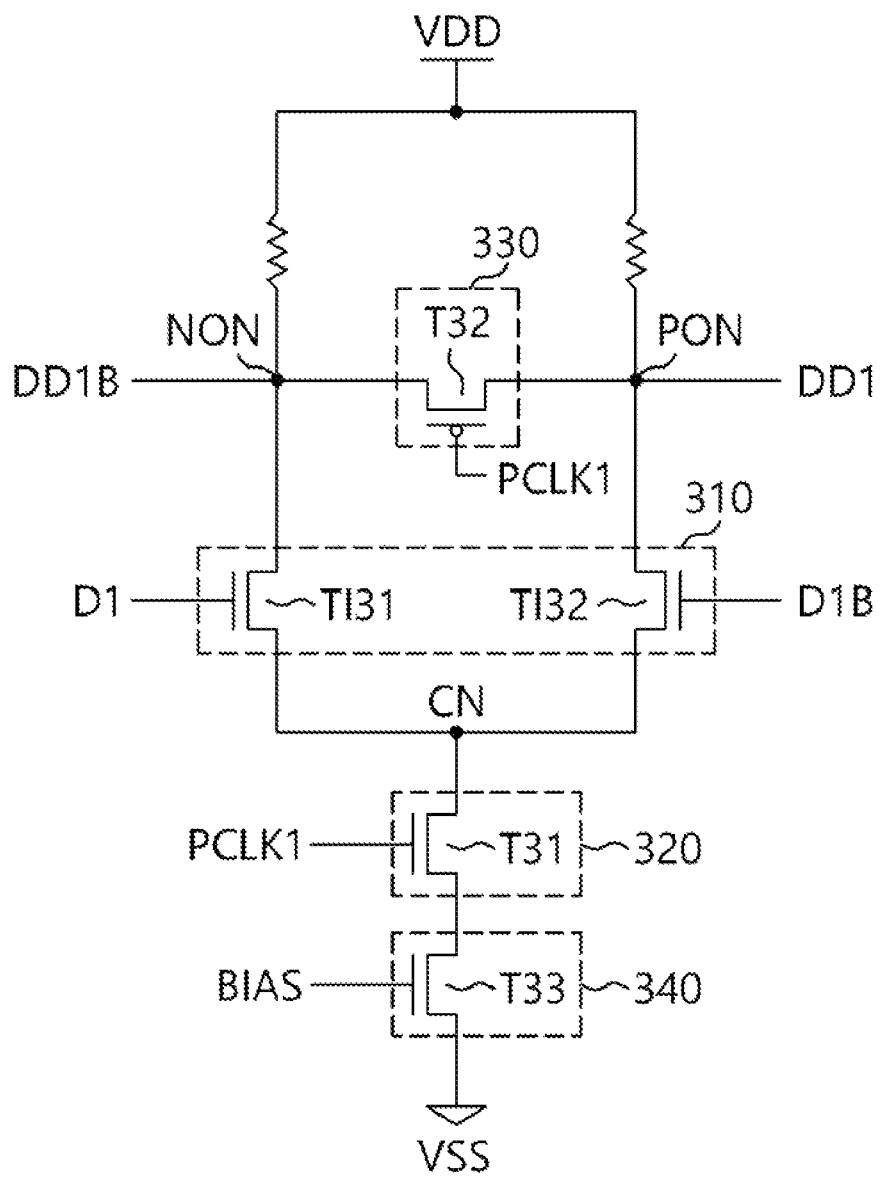
FIG. 3 is a schematic diagram illustrating a representation of an example of a configuration of a first pre-buffer illustrated in FIG. 2.

FIG. 3 is a schematic diagram illustrating a representation of an example of a configuration of the first pre-buffer 210 illustrated in FIG. 2. Each of the second to fourth pre-buffers 220 to 240 may be substantially the same as the first pre-buffer 210 except for an input signal thereof. Referring to FIG. 3, the first pre-buffer 210 may include an amplification unit 310 and a synchronization unit 320. The amplification unit 310 may receive the first signal D1 and a complementary signal D1B of the first signal D1. The amplification unit 310 may be coupled to a positive output node PON and a negative output node NON, and may change voltage levels of the positive output node PON and the negative output node NON based on the first signal D1 and the complementary signal D1B of the first signal D1. The positive output node PON and the negative output node NON may be provided with a power supply voltage VDD. Load resistances may be coupled between the positive output node PON and the power supply voltage VDD terminal and between the negative output node NON and the power supply voltage VDD terminal, respectively. The first delayed signal DD1 may be output from the positive output node PON, and a complementary signal DD1B of the first delayed signal DD1 may be output form the negative output node NON. The synchronization unit 320 may receive the first pre-clock signal PCLK1, and may form a current path between the amplification unit 310 and a ground node VSS based on the first pre-clock signal PCLK1. The synchronization unit 320 may form the current path during the high-level section of the first pre-clock signal PCLK1, and may allow the amplification unit 310 to change voltage levels of the positive output node PON and the negative output node NON according to the level of the first signal D1.

Referring to FIG. 3, the first pre-buffer 210 may further include a precharge unit 330 and an enablement unit 340. The precharge unit 330 may equalize the voltage levels of the positive output node PON and the negative output node NON based on the first pre-clock signal PCLK1. For example, the precharge unit 330 may couple the positive output node PON and the negative output node NON during a low level section of the first pre-clock signal PCLK1. The enablement unit 340 may receive a bias voltage BIAS and may couple the synchronization unit 320 and the ground node VSS. The bias voltage BIAS may be an arbitrary voltage, which may be applied to enable the serializer 100.

Referring to FIG. 3, the amplification unit 310 may include a first input transistor TI31 and a second input transistor TI32. Each of the first and second input transistors TI31 and TI32 may be N-channel type MOS transistors. The first input transistor TI31 may receive the first signal D1 at its gate, may be coupled to the negative output node NON at its drain, and may be coupled to a coupling node CN at its source. The second input transistor TI32 may receive the complementary signal D1B of the first signal D1 at its gate, may be coupled to the positive output node PON at its drain, and may be coupled to the coupling node CN at its source. The synchronization unit 320 may include a first transistor T31. The first transistor T31 may be N-channel type MOS transistors. The first transistor T31 may receive the first pre-clock signal PCLK1 at its gate, may be coupled to the coupling node CN at its drain, and may be coupled to the ground node VSS via the enablement unit 340 at its source. The precharge unit 330 may include a second transistor T32. The second transistor T32 may be a P-channel type MOS transistor. The second transistor T32 may receive the first pre-clock signal PCLK1 at its gate, one of its drain and source may be coupled to the positive output node PON, and the other one of its drain and source may be coupled to the negative output node NON. The enablement unit 340 may include a third transistor T33. The third transistor T33 may be an N-channel type MOS transistor. The third transistor T33 may receive the bias voltage BIAS at its gate, may be coupled to the source of the first transistor T31 at its drain, and may be coupled to the ground node VSS at its source.

Figure 4:
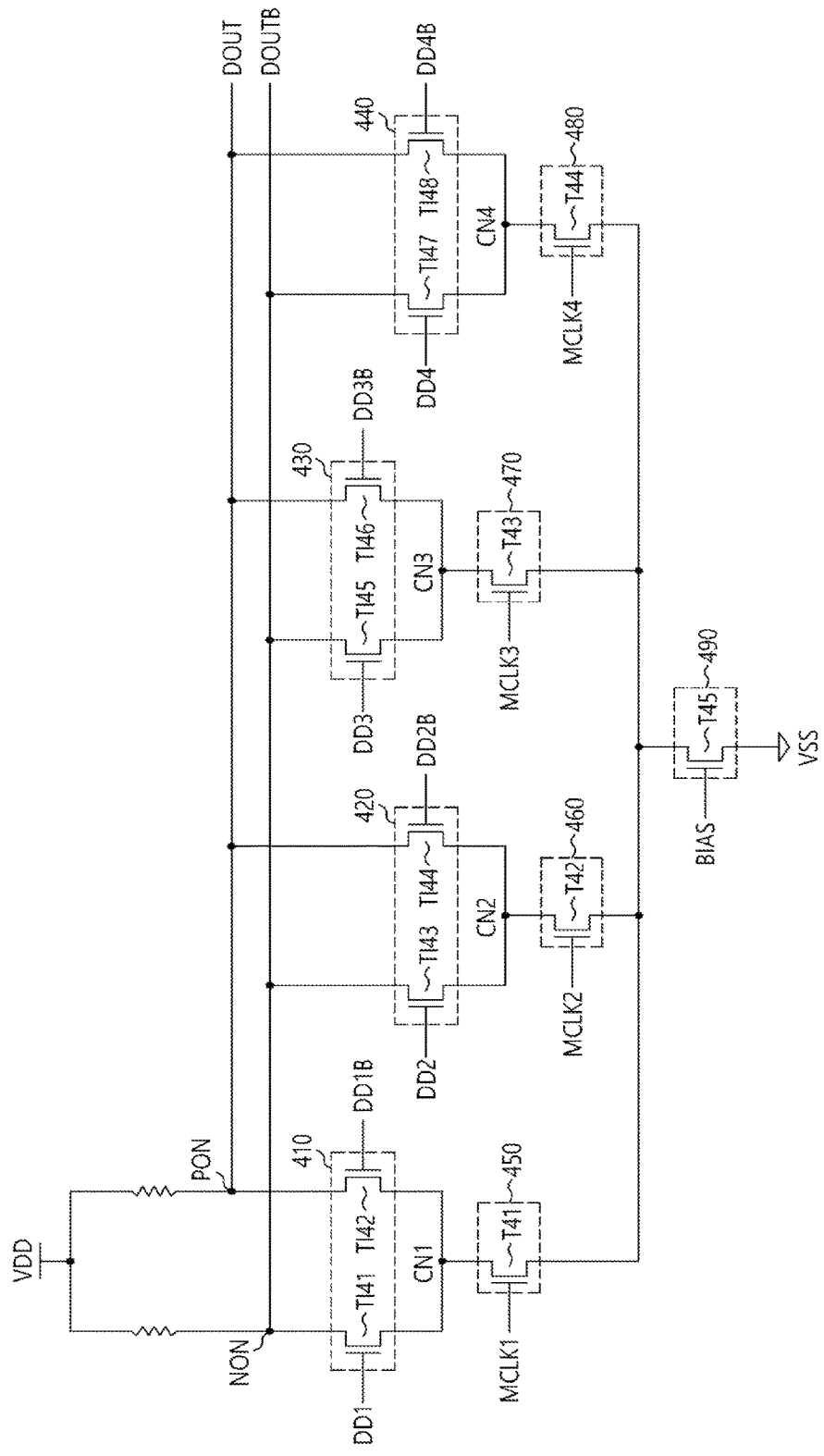
FIG. 4 is a schematic diagram illustrating a representation of an example of a configuration of a main buffer stage illustrated in FIG. 1.

FIG. 4 is a schematic diagram illustrating a representation of an example of a configuration of the main buffer stage 120 illustrated in FIG. 1. Referring to FIG. 4, the main buffer stage 120 may include a first amplification unit 410, a second amplification unit 420, a third amplification unit 430, a fourth amplification unit 440, a first synchronization unit 450, a second synchronization unit 460, a third synchronization unit 470 and a fourth synchronization unit 480. The first amplification unit 410 may receive the first delayed signal DD1 and a complementary signal DD1B of the first delayed signal DD1, and may change voltage levels of the positive output node PON and the negative output node NON. The positive output node PON and the negative output node NON may be provided with the power supply voltage VDD. Load resistances may be coupled between the positive output node PON and the power supply voltage VDD terminal and between the negative output node NON and the power supply voltage VDD terminal, respectively. The output signal DOUT may be output from the positive output node PON, and a complementary signal DOUTB of the output signal DOUT may be output form the negative output node NON. The second amplification unit 420 may receive the second delayed signal DD2 and a complementary signal DD2B of the second delayed signal DD2, and may change voltage levels of the positive output node PON and the negative output node NON. The third amplification unit 430 may receive the third delayed signal DD3 and a complementary signal DD3B of the third delayed signal DD3, and may change voltage levels of the positive output node PON and the negative output node NON. The fourth amplification unit 440 may receive the fourth delayed signal DD4 and a complementary signal DD4B of the fourth delayed signal DD4, and may change voltage levels of the positive output node PON and the negative output node NON.

The first synchronization unit 450 may receive the first main clock signal MCLK1, and may form a current path between the first amplification unit 410 and the ground node VSS during the high level section of the first main clock signal MCLK1. Therefore, the main buffer stage 120 may generate the output signal DOUT having a varying voltage level according to the first delayed signal DD1 during the high level section of the first main clock signal MCLK1. The second synchronization unit 460 may receive the second main clock signal MCLK2, and may form a current path between the second amplification unit 420 and the ground node VSS during the high level section of the second main clock signal MCLK2. Therefore, the main buffer stage 120 may generate the output signal DOUT having a varying voltage level according to the second delayed signal DD2 during the high level section of the second main clock signal MCLK2. The third synchronization unit 470 may receive the third main clock signal MCLK3, and may form a current path between the third amplification unit 430 and the ground node VSS during the high level section of the third main clock signal MCLK3. Therefore, the main buffer stage 120 may generate the output signal DOUT having a varying voltage level according to the third delayed signal DD3 during the high level section of the third main clock signal MCLK3. The fourth synchronization unit 480 may receive the fourth main clock signal MCLK4, and may form a current path between the fourth amplification unit 440 and the ground node VSS during the high level section of the fourth main clock signal MCLK4. Therefore, the main buffer stage 120 may generate the output signal DOUT having a varying voltage level according to the fourth delayed signal DD4 during the high level section of the fourth main clock signal MCLK4. Referring to FIG. 4, the main buffer stage 120 may further include an enablement unit 490. The enablement unit 490 may receive the bias voltage BIAS and may couple the first to fourth synchronization units 450 to 480 and the ground node VSS.

Referring to FIG. 4, the first amplification unit 410 may include a first input transistor TI41 and a second input transistor TI42. Each of the first and second input transistors TI41 and TI42 may be N-channel type MOS transistors. The first input transistor TI41 may receive the first delayed signal DD1 at its gate, may be coupled to the negative output node NON at its drain, and may be coupled to a first coupling node CN1 at its source. The second input transistor TI42 may receive the complementary signal DD1B of the first delayed signal DD1 at its gate, may be coupled to the positive output node PON at its drain, and may be coupled to the first coupling node CN1 at its source. The second amplification unit 420 may include a third input transistor TI43 and a fourth input transistor TI44. Each of the third and fourth input transistors TI43 and TI44 may be N-channel type MOS transistors. The third input transistor TI43 may receive the second delayed signal DD2 at its gate, may be coupled to the negative output node NON at its drain, and may be coupled to a second coupling node CN2 at its source. The fourth input transistor TI44 may receive the complementary signal DD2B of the second delayed signal DD2 at its gate, may be coupled to the positive output node PON at its drain, and may be coupled to the second coupling node CN2 at its source. The third amplification unit 430 may include a fifth input transistor TI45 and a sixth input transistor TI46. Each of the fifth and sixth input transistors TI45 and TI46 may be N-channel type MOS transistors. The fifth input transistor TI45 may receive the third delayed signal DD3 at its gate, may be coupled to the negative output node NON at its drain, and may be coupled to a third coupling node CN3 at its source. The sixth input transistor TI46 may receive the complementary signal DD3B of the third delayed signal DD3 at its gate, may be coupled to the positive output node PON at its drain, and may be coupled to the third coupling node CN3 at its source. The fourth amplification unit 440 may include a seventh input transistor TI47 and an eighth input transistor TI48. Each of the seventh and eighth input transistors TI47 and TI48 may be N-channel type MOS transistors. The seventh input transistor TI47 may receive the fourth delayed signal DD4 at its gate, may be coupled to the negative output node NON at its drain, and may be coupled to a fourth coupling node CN4 at its source. The eighth input transistor TI48 may receive the complementary signal DD4B of the fourth delayed signal DD4 at its gate, may be coupled to the positive output node PON at its drain, and may be coupled to the fourth coupling node CN4 at its source.

The first synchronization unit 450 may include a first transistor T41. The first transistor T41 may be an N-channel MOS type transistor. The first transistor T41 may receive the first main clock signal MCLK1 at its gate, may be coupled to the first coupling node CN1 at its drain, and may be coupled to the ground node VSS via the enablement unit 490 at its source. The second synchronization unit 460 may include a second transistor T42. The second transistor T42 may be an N-channel type MOS transistor. The second transistor T42 may receive the second main clock signal MCLK2 at its gate, may be coupled to the second coupling node CN2 at its drain, and may be coupled to the ground node VSS via the enablement unit 490 at its source. The third synchronization unit 470 may include a third transistor T43. The third transistor T43 may be an N-channel type MOS transistor. The third transistor T43 may receive the third main clock signal MCLK3 at its gate, may be coupled to the third coupling node CN3 at its drain, and may be coupled to the ground node VSS via the enablement unit 490 at its source. The fourth synchronization unit 480 may include a fourth transistor T44. The fourth transistor T44 may be an N-channel type MOS transistor. The fourth transistor T44 may receive the fourth main clock signal MCLK4 at its gate, may be coupled to the fourth coupling node CN4 at its drain, and may be coupled to the ground node VSS via the enablement unit 490 at its source. The enablement unit 490 may include a fifth transistor T45. The fifth transistor T45 may be an N-channel type MOS transistor. The fifth transistor T45 may receive the bias voltage BIAS at its gate, may be commonly coupled to the sources of the first to fourth transistors T41 to T44 at its drain, and may be coupled to the ground node VSS at its source.

Figure 5A:
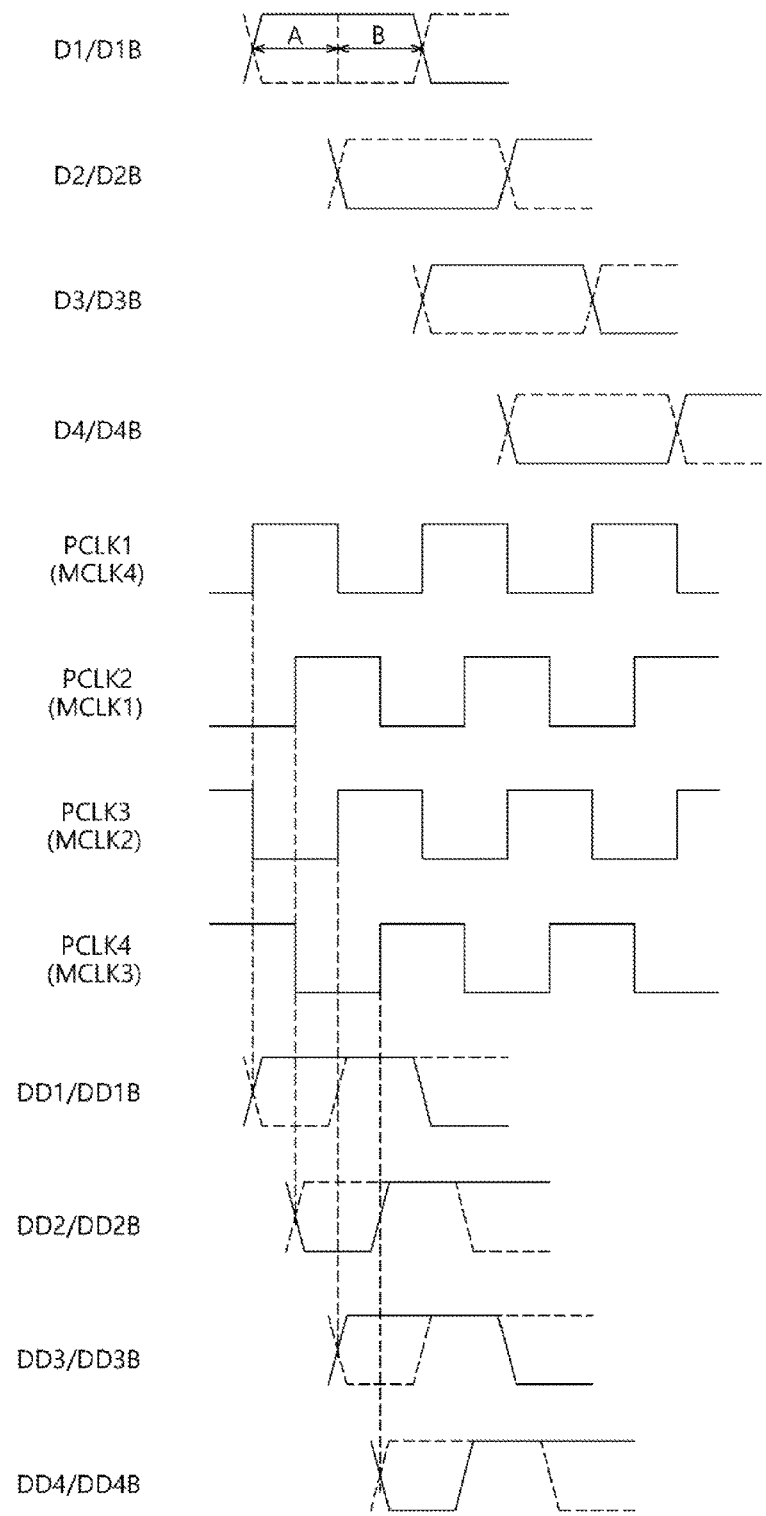
FIGS. 5A and 5B are timing diagrams illustrating a representation of an example of an operation of the serializer in accordance with an embodiment.
Figure 5B:
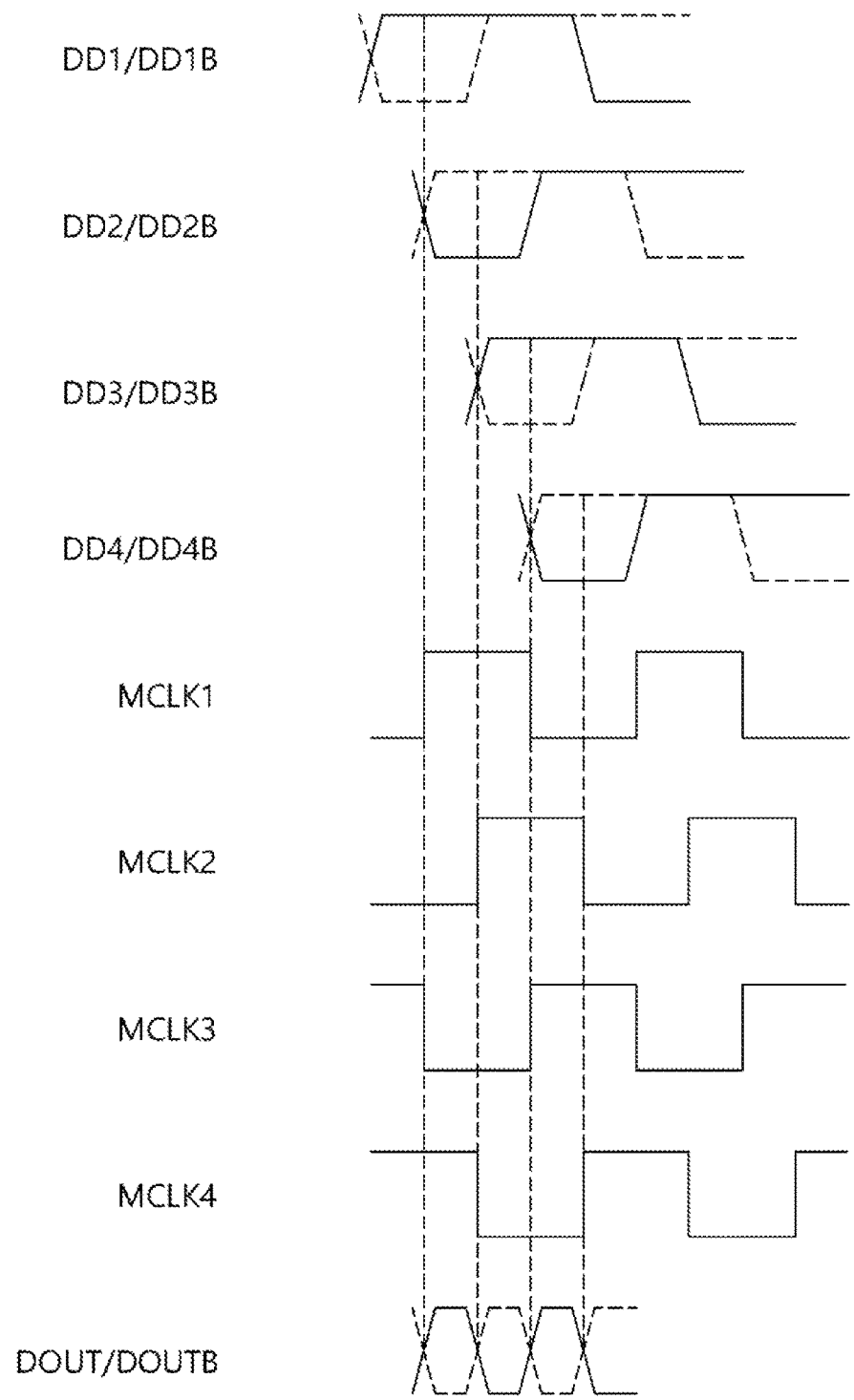

FIGS. 5A and 5B are timing diagrams illustrating a representation of an example of an operation of the serializer 100 in accordance with an embodiment. The operation of the serializer 100 in accordance with an embodiment will be described hereinafter with reference to FIGS. 1 to 5B. FIG. 5A is a timing diagram illustrating a representation of an example of an operation of the pre-buffer stage 110. In FIG. 5A, it is assumed, for the convenience of the description, that the first signal D1 and the third signal D3 are signals changing from a high level to a low level and the second signal D2 and the fourth signal D4 are signals changing a low level to a high level. In FIG. 5A, the first to fourth signals D1 to D4 and the first to fourth delayed signals DD1 to DD4 are represented by solid lines and the complementary signals D1B to D4B of the first to fourth signals D1 to D4 and the complementary signals DD1B to DD4B of the first to fourth delayed signals DD1 to DD4 are represented by dotted lines. The first to fourth pre-buffers 210 to 240 may perform amplification operations and precharge operations based on the first to fourth pre-clock signals PCLK1 to PCLK4 applied thereto, respectively.

The first pre-buffer 210 may output the first delayed signal DD1 and the complementary signal DD1B of the first delayed signal DD1 by differentially amplifying the first signal D1 and the complementary signals D1B of the first signal D1 during the high level section of the first pre-clock signal PCLK1, and may couple the positive output node PON and the negative output node NON and may precharge the positive output node PON and the negative output node NON to a high level during the low level section of the first pre-clock signal PCLK1. Therefore, a section A of the first signal D1 may be an evaluation section and a section B of the first signal D1 may be a precharge section. The first pre-buffer 210 may output the first delayed signal DD1 having a high level and the complementary signal DD1B having a low level based on the first signal D1 having a high level and the complementary signals D1B having a low level during the high level section of the first pre-clock signal PCLK1. The first pre-buffer 210 may precharge the first delayed signal DD1 and the complementary signal DD1B of the first delayed signal DD1 to a high level during the low level section of the first pre-clock signal PCLK1.

The second pre-buffer 220 may output the second delayed signal DD2 having a low level and the complementary signal DD2B having a high level based on the second signal D2 having a low level and the complementary signals D2B having a high level during the high level section of the second pre-clock signal PCLK2. The second pre-buffer 220 may precharge the second delayed signal DD2 and the complementary signal DD2B of the second delayed signal DD2 to a high level by during the low level section of the second pre-clock signal PCLK2.

The third pre-buffer 230 may output the third delayed signal DD3 having a high level and the complementary signal DD3B having a low level based on the third signal D3 having a high level and the complementary signals D3B having a low level during the high level section of the third pre-clock signal PCLK3. The third pre-buffer 230 may precharge the third delayed signal DD3 and the complementary signal DD3B of the third delayed signal DD3 to a high level by during the low level section of the third pre-clock signal PCLK3.

The fourth pre-buffer 240 may output the fourth delayed signal DD4 having a low level and the complementary signal DD4B having a high level based on the fourth signal D4 having a low level and the complementary signals D4B having a high level during the high level section of the fourth pre-clock signal PCLK4. The fourth pre-buffer 240 may precharge the fourth delayed signal DD4 and the complementary signal DD4B of the fourth delayed signal DD4 to a high level by during the low level section of the fourth pre-clock signal PCLK4.

FIG. 5B is a timing diagram illustrating a representation of an example of an operation of the main buffer stage 120. In FIG. 5B, the first to fourth delayed signals DD1 to DD4 and the output signal DOUT are represented by solid lines and the complementary signals DD1B to DD4B of the first to fourth delayed signals DD1 to DD4 and the complementary signal DOUTB of the output signal DOUT are represented by dotted lines. The main buffer stage 120 may generate the output signal DOUT and the complementary signal DOUTB of the output signal DOUT based on the first to fourth delayed signals DD1 to DD4, the complementary signals DD1B to DD4B of the first to fourth delayed signals DD1 to DD4 and the first to fourth main clock signals MCLK1 to MCLK4.

The main buffer stage 120 may generate the output signal DOUT having a high level and the complementary signal DOUTB having a low level by differentially amplifying the first delayed signal DD1 and the complementary signal DD1B of the first delayed signal DD1 during a high level section of the first main clock signal MCLK1. During the high level section of the first main clock signal MCLK1, the first synchronization unit 450 may be turned on, and the first amplification unit 410 may drive the positive output node PON to a high level and the negative output node NON to a low level by differentially amplifying the first delayed signal DD1 and the complementary signal DD1B of the first delayed signal DD1.

During a high level section of the second main clock signal MCLK2, the first delayed signal DD1 and the complementary signal DD1B of the first delayed signal DD1 may be precharged to a high level and thus the main buffer stage 120 may generate the output signal DOUT having a low level and the complementary signal DOUTB having a high level by differentially amplifying the second delayed signal DD2 and the complementary signal DD2B of the second delayed signal DD2. Even though the high level section of the second main clock signal MCLK2 may be overlapped with the high level section of the first main clock signal MCLK1 and both of the first and second synchronization units 450 and 460 may be turned on, the first delayed signal DD1 and the complementary signal DD1B of the first delayed signal DD1 may be in a state precharged to a high level and thus the voltage levels of the positive output node PON and the negative output node NON may be changed according to the second delayed signal DD2 and the complementary signal DD2B of the second delayed signal DD2. The second amplification unit 420 may drive the positive output node PON to a low level and the negative output node NON to a high level by differentially amplifying the second delayed signal DD2 and the complementary signal DD2B of the second delayed signal DD2.

During a high level section of the third main clock signal MCLK3, the second delayed signal DD2 and the complementary signal DD2B of the second delayed signal DD2 may be precharged to a high level and thus the main buffer stage 120 may generate the output signal DOUT having a high level and the complementary signal DOUTB having a low level by differentially amplifying the third delayed signal DD3 and the complementary signal DD3B of the third delayed signal DD3. Even though the high level section of the third main clock signal MCLK3 may be overlapped with the high level section of the second main clock signal MCLK2 and both of the second and third synchronization units 460 and 470 may be turned on, the second delayed signal DD2 and the complementary signal DD2B of the second delayed signal DD2 may be in a state precharged to a high level and thus the voltage levels of the positive output node PON and the negative output node NON may be changed according to the third delayed signal DD3 and the complementary signal DD3B of the third delayed signal DD3. The third amplification unit 430 may drive the positive output node PON to a high level and the negative output node NON to a low level by differentially amplifying the third delayed signal DD3 and the complementary signal DD3B of the third delayed signal DD3.

During a high level section of the fourth main clock signal MCLK4, the third delayed signal DD3 and the complementary signal DD3B of the third delayed signal DD3 may be precharged to a high level and thus the main buffer stage 120 may generate the output signal DOUT having a low level and the complementary signal DOUTB having a high level by differentially amplifying the fourth delayed signal DD4 and the complementary signal DD4B of the fourth delayed signal DD4. Even though the high level section of the fourth main clock signal MCLK4 may be overlapped with the high level section of the third main clock signal MCLK3 and both of the third and fourth synchronization units 470 and 480 may be turned on, the third delayed signal DD3 and the complementary signal DD3B of the third delayed signal DD3 may be in a state precharged to a high level and thus the voltage levels of the positive output node PON and the negative output node NON may be changed according to the fourth delayed signal DD4 and the complementary signal DD4B of the fourth delayed signal DD4. The fourth amplification unit 440 may drive the positive output node PON to a low level and the negative output node NON to a high level by differentially amplifying the fourth delayed signal DD4 and the complementary signal DD4B of the fourth delayed signal DD4. Therefore, the main buffer stage 120 may change the level of the output signal DOUT according to the levels of the first to fourth delayed signals DD1 to DD4 during high level sections of the first to fourth main clock signals MCLK1 to MCLK4, respectively, and the first to fourth delayed signals DD1 to DD4 may be sequentially serialized and output as the output signal DOUT.

Figure 6:
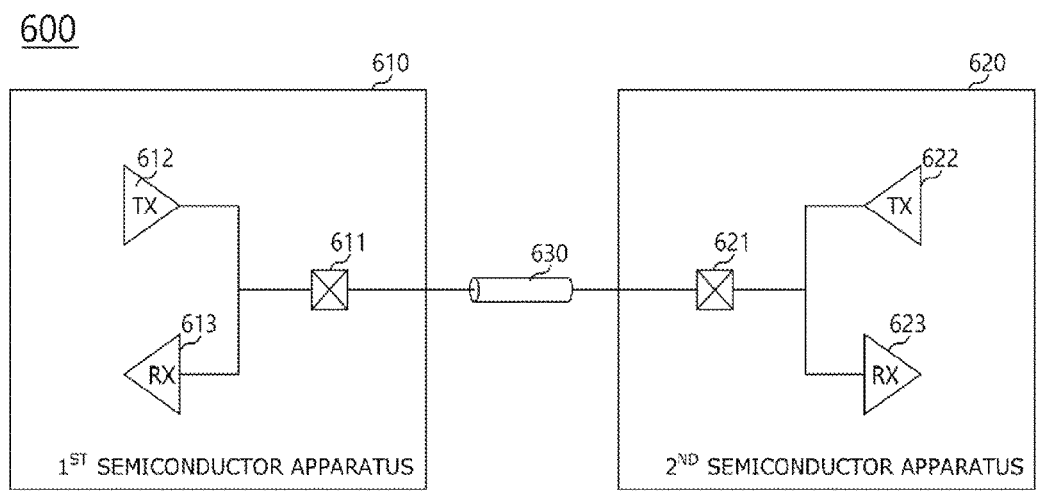
FIG. 6 is a schematic diagram illustrating a representation of an example of a configuration of a system in accordance with an embodiment.

FIG. 6 is a schematic diagram illustrating a representation of an example of a configuration of a system 600 in accordance with an embodiment. Referring to FIG. 6, the system 600 may include a first semiconductor apparatus 610 and a second semiconductor apparatus 620. The first semiconductor apparatus 610 and the second semiconductor apparatus 620 may be electronic elements configured to communicate with each other. In an embodiment, the first semiconductor apparatus 610 may be a master apparatus and the second semiconductor apparatus 620 may be a slave apparatus controlled by the first semiconductor apparatus 610. For example, the first semiconductor apparatus 610 may be a host device such as a processor including a central processing unit CPU, a graphic processing unit GPU, a multi-media processor MMP and a digital signal processor DSP. The processor may be implemented in a form of the system on chip (SoC) by combining processor chips having various functions such as the application processor (AP). The second semiconductor apparatus 620 may be a memory including a volatile memory and a non-volatile memory. The volatile memory may include the static RAM (SRAM), the dynamic RAM (DRAM), and the synchronous DRAM (SDRAM). The non-volatile memory may include the read only memory (ROM), the programmable ROM (PROM), the electrically erase and programmable ROM (EEPROM), the electrically programmable ROM (EPROM), the flash memory, the phase change RAM (PRAM), the magnetic RAM (MRAM), the resistive RAM (RRAM), and the ferroelectric RAM (FRAM).

The first and second semiconductor apparatuses 610 and 620 may be electrically coupled to each other through a signal transmission line 630. The first semiconductor apparatus 610 may include a pad 611, and the pad 611 may be electrically coupled to the signal transmission line 630. The second semiconductor apparatus 620 may include a pad 621, and the pad 621 may be electrically coupled to the signal transmission line 630. The signal transmission line 630 may be one of a channel, a link and a bus. The first semiconductor apparatus 610 may include a transmitter 612 and a receiver 613. The transmitter 612 may generate an output signal according to an internal signal of the first semiconductor apparatus 610, and may transmit the output signal to the second semiconductor apparatus 620 through the signal transmission line 630. The receiver 613 may generate an internal signal by receiving a signal transmitted from the second semiconductor apparatus 620 through the signal transmission line 630. In the similar manner, the second semiconductor apparatus 620 may include a transmitter 622 and a receiver 623. The transmitter 622 may generate an output signal according to an internal signal of the second semiconductor apparatus 620, and may transmit the output signal to the first semiconductor apparatus 610 through the signal transmission line 630. The receiver 623 may generate an internal signal by receiving a signal transmitted from the first semiconductor apparatus 610 through the signal transmission line 630.

The signal transmission line 630 may be a data bus, and a signal transmitted through the signal transmission line 630 may be data. The transmitter 612 of the first semiconductor apparatus 610 may transmit internal data of the first semiconductor apparatus 610 to the second semiconductor apparatus 620, and the receiver 613 of the first semiconductor apparatus 610 may receive data transmitted from the second semiconductor apparatus 620. The transmitter 622 of the second semiconductor apparatus 620 may transmit internal data of the second semiconductor apparatus 620 to the first semiconductor apparatus 610, and the receiver 623 of the second semiconductor apparatus 620 may receive data transmitted from the first semiconductor apparatus 610. The first and second semiconductor apparatuses 610 and 620 may perform serial communication with each other, and the signal transmission line 630 may transfer serial data. The first and second semiconductor apparatuses 610 and 620 may parallelize the serial data and use the parallelized data in order to promptly process a great amount of data. The receivers 613 and 623 may include parallelizer configured to parallelize provided serial data. The transmitters 612 and 622 may include serializers configured to serialize provided parallel data. The serializers 100 described with reference to FIG. 1 may be applied as the serializer included in the transmitters 612 and 622.

Figure 7:
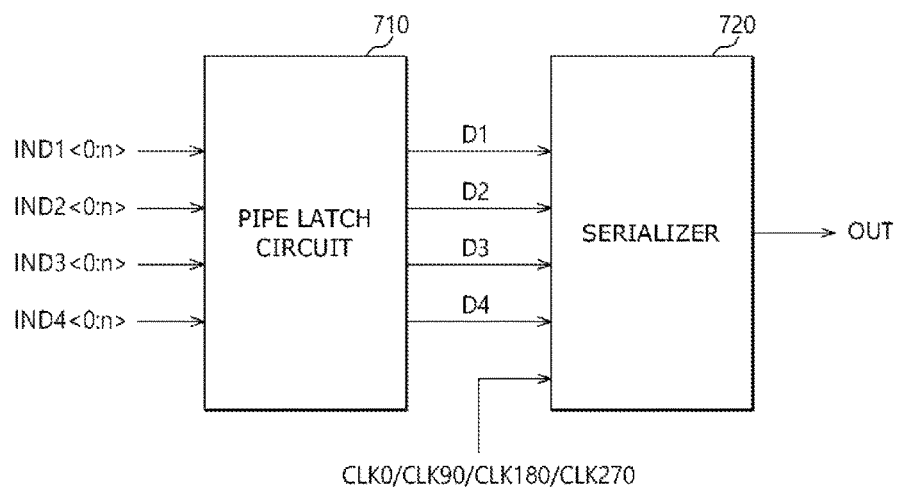
FIG. 7 is a schematic diagram illustrating a representation of an example of a configuration of a data transmission circuit in accordance with an embodiment.

FIG. 7 is a schematic diagram illustrating a representation of an example of a configuration of a data transmission circuit 700 in accordance with an embodiment. Referring to FIG. 7, the data transmission circuit 700 may be applied as the respective the transmitters 612 and 622 of the first and second semiconductor apparatuses 610 and 620. The data transmission circuit 700 may include a pipe latch circuit 710 and a serializer 720. The pipe latch circuit 710 may sequentially store a plurality of parallelized data through a pipelining operation. The pipe latch circuit 710 may receive a plurality of internal data groups IND1<0:n>, IND2<0:n>, IND3<0:n> and IND4<0:n>. The pipe latch circuit 710 may sequentially store the plurality of internal data groups IND1<0:n>, IND2<0:n>, IND3<0:n> and IND4<0:n> by using a pipe latch control signal. The plurality of internal data groups IND1<0:n>, IND2<0:n>, IND3<0:n> and IND4<0:n> may be parallelized data. The pipe latch circuit 710 may output the stored data as the first to fourth data D1 to D4.

The serializer 720 may receive the first to fourth data D1 to D4 and a plurality of clocks CLK0, CLK90, CLK180 and CLK270. The plurality of clocks CLK0, CLK90, CLK180 and CLK270 may have different phases from one another. The serializer 720 may output the first to fourth data D1 to D4 as an output data OUT by synchronizing the first to fourth data D1 to D4 to the plurality of clocks CLK0, CLK90, CLK180 and CLK270. As exemplified in FIG. 7, the data transmission circuit 700 may sequentially output the first to fourth data D1 to D4 as the output data OUT by performing a pipelining operation of arranging the plurality of internal data groups IND1<0:n>, IND2<0:n>, IND3<0:n> and IND4<0:n> and sequentially outputting the first to fourth data D1 to D4 and by synchronizing the first to fourth data D1 to D4 to the plurality of clocks CLK0, CLK90, CLK180 and CLK270. Therefore, the output data OUT may be serialized data. The plurality of clocks CLK0, CLK90, CLK180 and CLK270 may include a first phase clock signal CLK0, a second phase clock signal CLK90, a third phase clock signal CLK180 and a fourth phase clock signal CLK270, and the first to fourth phase clock signals CLK0, CLK90, CLK180 and CLK270 may have phase difference of 90 degrees with each other. These exemplified numbers of data and clock signals have no intention to limit the present disclosure. The pipe latch circuit 710 may perform a pipelining operation of sequentially outputting eight (8) internal data groups, and the serializer 720 may generate the output data OUT by using eight (8) phase clock signals having phase difference of 45 degrees with each other. For example, numbers of the phase clock signals and data may be greater or less than four depending on a desired configuration. The phase differences of the phase clock signals may be different from those described In accordance with an embodiment, the first to fourth data D1 to D4 may have windows or durations corresponding to periods of the first to fourth phase clock signals CLK0, CLK90, CLK180 and CLK270, respectively. The first to fourth data D1 to D4 may have phase difference corresponding to a quarter-period of the respective first to fourth phase clock signals CLK0, CLK90, CLK180 and CLK270 with each other for a double data rate operation. The serializers 100 described with reference to FIG. 1 may be applied as the serializer 720. The first phase clock signal CLK0 may be used as the first main clock signal MCLK1 and the second pre-clock signal PCLK2. The second phase clock signal CLK90 may be used as the second main clock signal MCLK2 and the third pre-clock signal PCLK3. The third phase clock signal CLK180 may be used as the third main clock signal MCLK3 and the fourth pre-clock signal PCLK4. The fourth phase clock signal CLK270 may be used as the fourth main clock signal MCLK4 and the first pre-clock signal PCLK1.

While certain embodiments have been described above, it will be understood to those skilled in the art that the embodiments described are by way of example only. Accordingly, the serializers, data transmitting circuits, semiconductor apparatuses and systems including the same should not be limited based on the described embodiments. Rather, the serializers, data transmitting circuits, semiconductor apparatuses and systems including the same described herein should only be limited in light of the claims that follow when taken in conjunction with the above description and accompanying drawings.

What is claimed is:

1. A serializer comprising:
   a pre-buffer configured to generate a plurality of delayed signals by buffering a plurality of signals in synchronization with first to fourth pre-clock signals sequentially having a phase difference of 90 degrees with each other, respectively; and
   a main buffer configured to generate an output signal by buffering the plurality of delayed signals in synchronization with first to fourth main clock signals sequentially having a phase difference of 90 degrees with each other, wherein the first to fourth main clock signals have lagging phases of 90 degrees to the first to fourth pre-clock signals, respectively.

2. The serializer of claim 1,
   wherein the first pre-clock signal has a phase corresponding to the fourth main clock signal,
   wherein the second pre-clock signal has a phase corresponding to the first main clock signal,
   wherein the third pre-clock signal has a phase corresponding to the second main clock signal, and
   wherein the fourth pre-clock signal has a phase corresponding to the third main clock signal.

3. A serializer comprising:
   a pre-buffer configured to generate a first delayed signal by buffering a first signal in synchronization with a first clock signal, and generate a second delayed signal by buffering a second signal in synchronization with a second clock signal having a lagging phase to the first clock signal; and
   a main buffer configured to generate an output signal by buffering the first delayed signal in synchronization with the second clock signal, and generate the output signal by buffering the second delayed signal in synchronization with a third clock signal having a lagging phase to the second clock signal.

4. The serializer of claim 3, wherein the pre-buffer further generates a third delayed signal by buffering a third signal in synchronization with the third clock signal,
   wherein the main buffer generates the output signal by further buffering the third delayed signal in synchronization with a fourth clock signal, and
   wherein the third clock signal has a leading phase to the fourth clock signal.

5. The serializer of claim 4, wherein the pre-buffer further generates a fourth delayed signal by buffering a fourth signal in synchronization with the fourth clock signal, and
   wherein the main buffer generates the output signal by further buffering the fourth delayed signal in synchronization with the first clock signal.

6. A serializer comprising:
   a pre-buffer configured to generate first to fourth delayed signals by buffering first to fourth signals in synchronization with a first clock signal, a second clock signal, a third clock signal, and a fourth clock signal, respectively; and
   a main buffer configured to generate an output signal by buffering the first to fourth delayed signals in synchronization with the second clock signal, the third clock signal, the fourth clock signal, and the first clock signal, respectively.

7. The serializer of claim 6, wherein the pre-buffer generates the first delayed signal by buffering the first signal in synchronization with the first clock signal,
   wherein the pre-buffer generates the second delayed signal by buffering the second signal in synchronization with the second clock signal,
   wherein the pre-buffer generates the third delayed signal by buffering the third signal in synchronization with the third clock signal, and
   wherein the pre-buffer generates the fourth delayed signal by buffering the fourth signal in synchronization with the fourth clock signal.

8. The serializer of claim 7, wherein the main buffer generates the output signal by buffering the first delayed signal in synchronization with the second clock signal,
   wherein the main buffer generates the output signal by buffering the second delayed signal in synchronization with the third clock signal,
   wherein the main buffer generates the output signal by buffering the third delayed signal in synchronization with the fourth clock signal, and
   wherein the main buffer generates the output signal by buffering the fourth delayed signal in synchronization with the first clock signal.

9. The serializer of claim 6, wherein the pre-buffer includes:
- a first pre-buffer configured to receive the first clock signal and the first signal, and output the first delayed signal;
- a second pre-buffer configured to receive the second clock signal and the second signal, and output the second delayed signal;
- a third pre-buffer configured to receive the third clock signal and the third signal, and output the third delayed signal; and
- a fourth pre-buffer configured to receive the fourth clock signal and the fourth signal, and output the fourth delayed signal.

10. The serializer of claim 9, wherein the first pre-buffer includes:
- an amplification circuit configured to receive the first signal and a complementary signal of the first signal and to change voltage levels of a positive output node and a negative output node; and
- a synchronization circuit configured to form a current path between the amplification circuit and a ground node based on the first clock signal,
- wherein a power supply voltage is provided to the positive output node and the negative output node, and the first delayed signal is output from the positive output node.

11. The serializer of claim 10, wherein the first pre-buffer further includes a precharge unit configured to equalize the voltage levels of the positive output node and the negative output node based on the first clock signal.

12. The serializer of claim 6, wherein the main buffer includes:
- a first amplification circuit configured to receive the first delayed signal and a complementary signal of the first delayed signal and to change voltage levels of a positive output node and a negative output node;
- a second amplification circuit configured to receive the second delayed signal and a complementary signal of the second delayed signal and to change voltage levels of the positive output node and the negative output node;
- a third amplification circuit configured to receive the third delayed signal and a complementary signal of the third delayed signal and to change voltage levels of the positive output node and the negative output node;
- a fourth amplification circuit configured to receive the fourth delayed signal and a complementary signal of the fourth delayed signal and to change voltage levels of the positive output node and the negative output node;
- a first synchronization circuit configured to form a current path between the first amplification circuit and a ground node based on the second clock signal;
- a second synchronization circuit configured to form a current path between the second amplification circuit and the ground node based on the third clock signal;
- a third synchronization circuit configured to form a current path between the third amplification circuit and the ground node based on the fourth clock signal; and
- a fourth synchronization circuit configured to form a current path between the fourth amplification circuit and the ground node based on the first clock signal, and
- wherein a power supply voltage is provided to the positive output node and the negative output node, and the output signal is output from the positive output node.

13. A data transmission circuit comprising:
- a pipe latch circuit configured to output first to fourth data by arranging a plurality of internal data groups;
- a pre-buffer configured to generate first to fourth delayed data by buffering the first to fourth data in synchronization with a first clock signal, a second clock signal, a third clock signal, and a fourth clock signal, respectively; and
- a main buffer configured to generate an output data by buffering the first to fourth delayed data in synchronization with the second clock signal, the third clock signal, the fourth clock signal, and the first clock signal, respectively.

14. The data transmission circuit of claim 13, wherein the pre-buffer generates the first delayed data by buffering the first data in synchronization with the first clock signal,
- wherein the pre-buffer generates the second delayed data by buffering the second data in synchronization with the second clock signal,
- wherein the pre-buffer generates the third delayed data by buffering the third data in synchronization with the third clock signal, and
- wherein the pre-buffer generates the fourth delayed data by buffering the fourth data in synchronization with the fourth clock signal.

15. The data transmission circuit of claim 13, wherein the main buffer generates the output data by buffering the first delayed data in synchronization with the second clock signal,
- wherein the main buffer generates the output data by buffering the second delayed data in synchronization with the third clock signal,
- wherein the main buffer generates the output data by buffering the third delayed data in synchronization with the fourth clock signal, and
- wherein the main buffer generates the output data by buffering the fourth delayed data in synchronization with the first clock signal.

16. The data transmission circuit of claim 13, wherein the pre-buffer includes:
- a first pre-buffer configured to receive the first clock signal and the first data, and output the first delayed data;
- a second pre-buffer configured to receive the second clock signal and the second data, and output the second delayed data;
- a third pre-buffer configured to receive the third clock signal and the third data, and output the third delayed data; and
- a fourth pre-buffer configured to receive the fourth clock signal and the fourth data, and output the fourth delayed data.

17. The data transmission circuit of claim 13, wherein the main buffer includes:
- a first amplification circuit configured to receive the first delayed data and a complementary signal of the first delayed data and to change voltage levels of a positive output node and a negative output node;
- a second amplification circuit configured to receive the second delayed data and a complementary signal of the second delayed data and to change voltage levels of the positive output node and the negative output node;
- a third amplification circuit configured to receive the third delayed data and a complementary signal of the third delayed data and to change voltage levels of the positive output node and the negative output node;
- a fourth amplification circuit configured to receive the fourth delayed data and a complementary signal of the fourth delayed data and to change voltage levels of the positive output node and the negative output node;

a first synchronization circuit configured to form a current path between the first amplification circuit and a ground node based on the second clock signal;

a second synchronization circuit configured to form a current path between the second amplification circuit and the ground node based on the third clock signal;

a third synchronization circuit configured to form a current path between the third amplification circuit and the ground node based on the fourth clock signal; and a fourth synchronization circuit configured to form a current path between the fourth amplification circuit and the ground node based on the first clock signal, and wherein a power supply voltage is provided to the positive output node and the negative output node, and the output data is output from the positive output node.

* * * * *